(12) United States Patent
Wu et al.

(10) Patent No.: US 7,799,705 B1
(45) Date of Patent: *Sep. 21, 2010

(54) METHODS FOR PRODUCING LOW STRESS POROUS LOW-K DIELECTRIC MATERIALS USING PRECURSORS WITH ORGANIC FUNCTIONAL GROUPS

(75) Inventors: Qingguo Wu, Tualatin, OR (US);
Haiying Fu, West Linn, OR (US); David C. Smith, Lake Oswego, OR (US);
David Mordo, Cupertino, CA (US)

(73) Assignee: Novellus Systems, Inc., San Jose, CA (US)

( * ) Notice: Subject to any disclaimer, the term of this patent is extended or adjusted under 35 U.S.C. 154(b) by 24 days.

This patent is subject to a terminal disclaimer.

(21) Appl. No.: 12/348,791

(22) Filed: Jan. 5, 2009

Related U.S. Application Data

(60) Continuation of application No. 11/764,750, filed on Jun. 18, 2007, now Pat. No. 7,473,653, which is a division of application No. 10/927,777, filed on Aug. 27, 2004, now Pat. No. 7,241,704, which is a continuation-in-part of application No. 10/672,311, filed on Sep. 26, 2003, now Pat. No. 7,208,389, which is a continuation-in-part of application No. 10/404,693, filed on Mar. 31, 2003, now abandoned.

(60) Provisional application No. 60/469,433, filed on May 9, 2003.

(51) Int. Cl.
*H01L 21/31* (2006.01)
*H01L 21/469* (2006.01)
*C23C 16/40* (2006.01)
*C23C 16/56* (2006.01)

(52) U.S. Cl. .................. 438/781; 438/789; 438/790; 427/557

(58) Field of Classification Search ............ 427/255.28, 427/255.18, 255.27, 255.37, 255.393, 387, 427/551, 553, 557; 438/507, 509, 780–782, 438/787, 788, 789, 790, 783, 784
See application file for complete search history.

(56) References Cited

U.S. PATENT DOCUMENTS 4,357,451 A    11/1982  McDaniel (Continued)

FOREIGN PATENT DOCUMENTS

WO    WO 03/005429 A1    1/2003
WO    WO 03/052794 A2    6/2003

OTHER PUBLICATIONS

U.S. Notice of Allowance and Fee Due mailed Feb. 3, 2010, from U.S. Appl. No. 11/936,754.

(Continued)

*Primary Examiner*—Mary Wilczewski
(74) *Attorney, Agent, or Firm*—Weaver Austin Villeneuve & Sampson LLP

(57) ABSTRACT

Methods of preparing a low stress porous low-k dielectric material on a substrate are provided. The methods involve the use of a structure former precursor and/or porogen precursor with one or more organic functional groups. In some cases, the structure former precursor has carbon-carbon double or triple bonds. In other cases, one or both of the structure former precursor and porogen precursor has one or more bulky organic groups. In other cases, the structure former precursor has carbon-carbon double or triple bonds and one or both of the structure former precursor and porogen precursor has one or more bulky organic groups. Once the precursor film is formed, the porogen is removed, leaving a porous low-k dielectric matrix with high mechanical strength. Different types of structure former precursors and porogen precursors are described. The resulting low stress low-k porous film may be used as a low-k dielectric film in integrated circuit manufacturing applications.

20 Claims, 7 Drawing Sheets

U.S. PATENT DOCUMENTS

| | | |
|---|---|---|
| 4,837,185 A | 6/1989 | Yau et al. |
| 4,885,262 A | 12/1989 | Ting et al. |
| 5,088,003 A | 2/1992 | Sakai et al. |
| 5,504,042 A | 4/1996 | Cho et al. |
| 5,686,054 A | 11/1997 | Barthel et al. |
| 5,851,715 A | 12/1998 | Barthel et al. |
| 5,858,457 A | 1/1999 | Brinker et al. |
| 6,020,035 A | 2/2000 | Gupta et al. |
| 6,140,252 A | 10/2000 | Cho et al. |
| 6,232,658 B1 | 5/2001 | Catabay et al. |
| 6,258,735 B1 | 7/2001 | Xia et al. |
| 6,268,288 B1 | 7/2001 | Hautala et al. |
| 6,270,846 B1 | 8/2001 | Brinker et al. |
| 6,271,273 B1 | 8/2001 | You et al. |
| 6,329,017 B1 | 12/2001 | Liu et al. |
| 6,340,628 B1 | 1/2002 | Van Cleemput et al. |
| 6,365,266 B1 | 4/2002 | MacDougall et al. |
| 6,365,528 B1 | 4/2002 | Sukharev et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,392,017 B1 | 5/2002 | Chandrashekar |
| 6,407,013 B1 | 6/2002 | Li et al. |
| 6,410,462 B1 | 6/2002 | Yang et al. |
| 6,413,583 B1 | 7/2002 | Moghadam et al. |
| 6,420,441 B1 | 7/2002 | Allen et al. |
| 6,436,824 B1 | 8/2002 | Chooi et al. |
| 6,444,715 B1 | 9/2002 | Mukherjee et al. |
| 6,465,366 B1 | 10/2002 | Nemani et al. |
| 6,479,374 B1 | 11/2002 | Ioka et al. |
| 6,479,409 B2 | 11/2002 | Shioya et al. |
| 6,548,113 B1 | 4/2003 | Birnbaum et al. |
| 6,558,755 B2 | 5/2003 | Berry et al. |
| 6,566,278 B1 | 5/2003 | Harvey et al. |
| 6,570,256 B2 | 5/2003 | Conti et al. |
| 6,572,925 B2 | 6/2003 | Zubkov et al. |
| 6,576,300 B1 | 6/2003 | Berry et al. |
| 6,596,654 B1 | 7/2003 | Bayman et al. |
| 6,610,362 B1 | 8/2003 | Towle |
| 6,632,478 B2 | 10/2003 | Gaillard et al. |
| 6,662,631 B2 | 12/2003 | Baklanov et al. |
| 6,677,251 B1 | 1/2004 | Lu et al. |
| 6,713,407 B1 | 3/2004 | Cheng et al. |
| 6,740,602 B1 | 5/2004 | Hendriks et al. |
| 6,756,085 B2 | 6/2004 | Waldfried et al. |
| 6,759,098 B2 | 7/2004 | Han et al. |
| 6,797,643 B2 | 9/2004 | Rocha-Alvarez et al. |
| 6,812,043 B2 | 11/2004 | Bao et al. |
| 6,815,373 B2 | 11/2004 | Singh et al. |
| 6,831,284 B2 | 12/2004 | Demos et al. |
| 6,867,086 B1 | 3/2005 | Chen et al. |
| 6,890,850 B2 | 5/2005 | Lee et al. |
| 6,903,004 B1 | 6/2005 | Spencer et al. |
| 6,914,014 B2 | 7/2005 | Li et al. |
| 6,921,727 B2 | 7/2005 | Chiang et al. |
| 7,064,088 B2 | 6/2006 | Hyodo et al. |
| 7,087,271 B2 | 8/2006 | Rhee et al. |
| 7,094,713 B1 | 8/2006 | Niu et al. |
| 7,098,149 B2 | 8/2006 | Lukas et al. |
| 7,166,531 B1 | 1/2007 | van den Hoek et al. |
| 7,176,144 B1 | 2/2007 | Wang et al. |
| 7,208,389 B1 * | 4/2007 | Tipton et al. ............... 438/409 |
| 7,241,704 B1 | 7/2007 | Wu et al. |
| 7,288,292 B2 | 10/2007 | Gates et al. |
| 7,326,444 B1 | 2/2008 | Wu et al. |
| 7,341,761 B1 | 3/2008 | Wu et al. |
| 7,381,659 B2 | 6/2008 | Nguyen et al. |
| 7,381,662 B1 | 6/2008 | Niu et al. |
| 7,390,537 B1 | 6/2008 | Wu et al. |
| 7,473,653 B1 | 1/2009 | Wu et al. |
| 7,629,224 B1 | 12/2009 | van den Hoek et al. |
| 7,695,765 B1 | 4/2010 | Fox et al. |
| 2002/0001973 A1 | 1/2002 | Wu et al. |
| 2002/0034626 A1 | 3/2002 | Liu et al. |
| 2002/0106500 A1 | 8/2002 | Albano et al. |
| 2002/0132496 A1 | 9/2002 | Ball et al. |
| 2002/0172766 A1 | 11/2002 | Laxman et al. |
| 2003/0064154 A1 | 4/2003 | Laxman et al. |
| 2003/0064607 A1 | 4/2003 | Leu et al. |
| 2003/0077896 A1 | 4/2003 | Saito et al. |
| 2003/0111263 A1 | 6/2003 | Fornof et al. |
| 2003/0203652 A1 | 10/2003 | Bao et al. |
| 2003/0224156 A1 | 12/2003 | Kirner et al. |
| 2004/0018717 A1 | 1/2004 | Fornof et al. |
| 2004/0069410 A1 | 4/2004 | Moghadam et al. |
| 2004/0096593 A1 | 5/2004 | Lukas et al. |
| 2004/0096672 A1 | 5/2004 | Lukas et al. |
| 2004/0099952 A1 | 5/2004 | Goodner et al. |
| 2004/0101633 A1 | 5/2004 | Zheng et al. |
| 2004/0161532 A1 | 8/2004 | Kloster et al. |
| 2004/0166240 A1 | 8/2004 | Rhee et al. |
| 2004/0170760 A1 | 9/2004 | Meagley et al. |
| 2004/0185679 A1 | 9/2004 | Ott et al. |
| 2004/0213911 A1 | 10/2004 | Misawa et al. |
| 2004/0249006 A1 | 12/2004 | Gleason et al. |
| 2005/0025892 A1 | 2/2005 | Satoh et al. |
| 2005/0064698 A1 | 3/2005 | Chang et al. |
| 2005/0095840 A1 | 5/2005 | Bhanap et al. |
| 2005/0156285 A1 | 7/2005 | Gates et al. |
| 2005/0230834 A1 | 10/2005 | Schmitt et al. |
| 2005/0260357 A1 | 11/2005 | Olsen et al. |
| 2005/0260420 A1 | 11/2005 | Collins et al. |
| 2006/0024976 A1 | 2/2006 | Waldfried et al. |
| 2006/0027929 A1 | 2/2006 | Cooney et al. |
| 2006/0040507 A1 | 2/2006 | Mak et al. |
| 2006/0105566 A1 | 5/2006 | Waldfried et al. |
| 2006/0110931 A1 | 5/2006 | Fukazawa et al. |
| 2006/0145304 A1 | 7/2006 | Boyanov et al. |
| 2006/0145305 A1 | 7/2006 | Boyanov et al. |
| 2006/0178006 A1 | 8/2006 | Xu et al. |
| 2008/0009141 A1 | 1/2008 | Dubois et al. |
| 2008/0132055 A1 | 6/2008 | Nguyen et al. |
| 2008/0194105 A1 | 8/2008 | Dominquez et al. |

OTHER PUBLICATIONS

Allowed Claims from U.S. Appl. No. 11/936,754, allowed claims submitted on Sep. 21, 2009.

U.S. Appl. No. 11/606,340, Office Action mailed Feb. 5, 2009.

U.S. Notice of Allowance and Fee Due mailed Jul. 28, 2009, from U.S. Appl. No. 11/606,340.

Allowed Claims from U.S. Appl. No. 11/606,340, Dec. 8, 2009.

U.S. Final Office Action for U.S. Appl. No. 11/369,658 mailed Mar. 18, 2010.

U.S. Office Action for U.S. Appl. No. 11/608,056 mailed Mar. 23, 2010.

U.S. Office Action for U.S. Appl. No. 11/693,661 mailed Feb. 24, 2010.

U.S. Notice of Allowance and Fee Due mailed Apr. 12, 2010, from U.S. Appl. No. 10/820,525.

Allowed Claims for U.S. Appl. No. 10/820,525, allowed claims submitted on Nov. 9, 2009.

Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Jan, C.H., et al, *90NM Generation, 300mm Wafer Low k ILD/Cu Interconnect Technology*, 2003 IEEE Interconnect Technology Conference.

Wu et al., U.S. Appl. No. 10/820,525, entitled: Methods for Producing Low-K CDO Films With Low Residual Stress, filed Apr. 7, 2004.

Gangpadhyay et al., "The First International Surface Cleaning Workshop," Northeastern University, Nov. 11-14, 2002.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

U.S. Office Action dated Mar. 2, 2005, from U.S. Appl. No. 10/860,340.

U.S Final Office Action mailed Jun. 13, 2005, from U.S. Appl. No. 10/860,340.

Fox et al., "Methods For Producing Low-Stress Carbon-Doped Oxide Films With Improved Integration Properties", U.S. Appl. No. 10/987,208, filed Nov. 12, 2004.

U.S. Office Action mailed Dec. 27, 2005, from U.S. Appl. No. 10/789,103.

U.S. Office Action mailed Dec. 23, 2005, from U.S. Appl. No. 10/800,409.

U.S. Office Action mailed May 31, 2006, from U.S. Appl. No. 10/941,502.

U.S. Office Action mailed Jun. 15, 2006, from U.S. Appl. No. 10/800,409.

U.S. Office Action mailed Jun. 14, 2006, from U.S. Appl. No. 10/789,103.

U.S. Office Action mailed Sep. 7, 2006, from U.S. Appl. No. 10/820,525.

U.S. Office Action mailed Nov. 30, 2006, from U.S. Appl. No. 10/927,777.

U.S. Office Action mailed Mar. 28, 2007, from U.S. Appl. No. 10/820,525.

U.S. Office Action mailed Jan. 24, 2007, from U.S. Appl. No. 10/789,103.

U.S. Office Action mailed Jun. 21, 2007, from U.S. Appl. No. 10/789,103.

U.S. Notice of Allowance and Fee Due mailed Dec. 19, 2006, from U.S. Appl. No. 10/800,409.

U.S. Office Action mailed Apr. 9, 2007, from U.S. Appl. No. 10/800,409.

Niu et al., "Methods for Improving the Cracking Resistance of Low-K Dielectric Materials," Novellus Systems, Inc., U.S. Appl. No. 11/376,510, filed Mar. 14, 2006, pp. 1-28.

U.S. Office Action dated May 22, 2007, from U.S. Appl. No. 11/376,510.

U.S. Notice of Allowance and Fee Due mailed Apr. 9, 2007, from U.S. Appl. No. 10/927,777.

Allowed Claims from U.S. Appl. No. 10/927,777, Jul. 10, 2007.

U.S. Final Office Action mailed Apr. 3, 2007, from U.S. Appl. No. 10/941,502.

U.S. Notice of Allowance and Fee Due mailed Dec. 20, 2005, from U.S. Appl. No. 10/860,340.

Allowed Claims from U.S. Appl. No. 10/860,340, Aug. 22, 2006.

Wu et al., "PECVD Methods for Producing Ultra Low-K Dielectric Films Using UV Treatment," Novellus Systems, Inc., U.S. Appl. No. 11/608,056, filed Dec. 7, 2006, pp. 1-34.

Wu et al., "Methods for Improving Performance of ODC Films with Dielectric Constant < 4.0," Novellus Systems, Inc., U.S. Appl. No. 11/693,661, filed Mar. 29, 2007, pp. 1-46.

U.S. Notice of Allowance and Fee Due mailed Sep. 19, 2007, from U.S. Appl. No. 10/800,409.

Allowed Claims from U.S. Appl. No. 10/800,409, Mar. 11, 2008.

U.S. Office Action dated Nov. 28, 2007, from U.S. Appl. No. 10/807,680.

R.J. Lewis, Sr., Hawley's Condensed Chemical Dictionary, 12$^{th}$ Edition, Van Nostrand Reinhold Co., New York, 1993 (no month), excerpts pp. 916-918 & 1123-1124.

U.S. Office Action mailed Oct. 4, 2007, from U.S. Appl. No. 10/820,525.

Wu et al., "Methods For Producing Low Stress Porous Low-K Dielectric Materials Using Precursors With Organic Functional Groups", U.S. Appl. No. 11/764,750, filed Jun. 18, 2007.

U.S. Office Action mailed Oct. 29, 2007, from U.S. Appl. No. 11/764,750.

Wu et al., Methods For Producing Low-K CDO Films, U.S. Appl. No. 11/936,754, filed Nov. 7, 2007.

Wu et al., "Methods For Improving Integration Performance of Low Stress CDO Films", U.S. Appl. No. 11/936,752, filed Nov. 7, 2007.

U.S. Notice of Allowance and Fee Due mailed Sep. 27, 2007, from U.S. Appl. No. 11/376,510.

Allowed Claims from U.S. Appl. No. 11/376,510, Jun. 3, 2008.

U.S. Notice of Allowance and Fee Due mailed Sep. 20, 2007, from U.S. Appl. No. 10/941,502.

Allowed Claims from U.S. Appl. No. 10/941,502, Feb. 5, 2008.

U.S. Notice of Allowance and Fee Due mailed Feb. 11, 2008, from U.S. Appl. No. 10/789,103.

Allowed Claims from U.S. Appl No. 10/789,103.

U.S. Office Action mailed Mar. 31, 2008, from U.S. Appl. No. 10/820,525, Jun. 24, 2008.

U.S. Office Action dated Jul. 10, 2008, from U.S. Appl. No. 10/807,680.

U.S. Office Action mailed Aug. 5, 2008, from U.S. Appl. No. 10/987,208.

U.S. Final Office Action mailed May 29, 2008, from U.S. Appl. No. 11/764,750.

U.S. Notice of Allowance and Fee Due mailed Aug. 25, 2008, from U.S. Appl. No. 11/764,750.

Allowed Claims from U.S. Appl. No. 11/764,750, Jan. 6, 2009.

Solomons and Fryhle, Organic Chemistry, 9$^{th}$ Edition, John Wiley & Sons, Inc., 2008, pp. 602-603.

Wu et al., Methods for Fabricating High Hardness/Modulus Low Dielectric Constant Materials, Novellus Systems, Inc., U.S. Appl. No. 11/369,658, filed Mar. 6, 2006.

Szekeres, A et al., "Plasma-assisted chemical vapor depositing silicon oxynitride as an alternative material for gate dielectric in MOS devices." Microelectronics Journal 37 (2006) pp. 64-70.

U.S. Final Office Action for U.S. Appl. No. 10/820,525 mailed Dec. 4, 2008.

U.S. Office Action for U.S. Appl. No. 11/369,658 mailed Dec. 12, 2008.

U.S. Office Action for U.S. Appl. No. 10/987,208 mailed Feb. 4, 2009.

U.S. Office Action for U.S. Appl. No. 11/936,754 mailed Jun. 19, 2009.

U.S. Final Office Action for U.S. Appl. No. 10/987,208 mailed Jul. 10, 2009.

U.S. Office Action for U.S. Appl. No. 11/369,658 mailed Jul. 8, 2009.

U.S. Office Action for U.S. Appl. No. 11/608,056 mailed Aug. 20, 2009.

U.S. Office Action for U.S. Appl. No. 10/820,525 mailed Aug. 7, 2009.

U.S. Office Action for U.S. Appl. No. 11/693,661 mailed Aug. 28, 2009.

U.S. Supplemental Notice of Allowance and Fee Due mailed May 1, 2008, from U.S. Appl. No. 11/376,510.

U.S. Final Office Action for U.S. Appl. No. 10/807,680 mailed Jul. 10, 2008.

Wu et al., "Methods For Producing Low Stress Porous Low-K Dielectric Materials Using Precursors With Organic Functional Groups", U.S. Appl. No. 12/348,791, filed Jan. 5, 2009.

Wu et al., "Methods For Producing Low Stress Porous Low-K Dielectric Materials Using Precursors With Organic Functional Groups", U.S. Appl. No. 12/479,114, filed Jun. 5, 2009.

Van Den Hoek, et al., "VLSI Fabrication Processes For Introducing Pores Into Dielectric Materials," Novellus Systems, Inc., U.S. Appl. No. 12/606,920, filed Oct. 27, 2009.

U.S. Notice of Allowance and Fee Due mailed Nov. 24, 2009, from U.S. Appl. No. 10/987,208.

Allowed Claims from U.S. Appl. No. 10/987,208, Apr. 13, 2010.

* cited by examiner

METHODS FOR PRODUCING LOW STRESS POROUS LOW-K DIELECTRIC MATERIALS USING PRECURSORS WITH ORGANIC FUNCTIONAL GROUPS

CROSS-REFERENCE TO RELATED APPLICATIONS

This application is a continuation claiming priority under 35 USC 120 from U.S. patent application Ser. No. 11/764,750, filed on Jun. 18, 2007, titled "METHODS FOR PRODUCING LOW STRESS POROUS LOW-K DIELECTRIC MATERIALS USING PRECURSORS WITH ORGANIC FUNCTIONAL GROUPS," by Wu et al. as inventors, which is a divisional claiming priority under 35 USC 120 from U.S. patent application Ser. No. 10/927,777, filed on Aug. 27, 2004, which is now U.S. Pat. No. 7,241,704, issued on Jul. 10, 2007, titled "METHODS FOR PRODUCING LOW STRESS POROUS LOW-K DIELECTRIC MATERIALS USING PRECURSORS WITH ORGANIC FUNCTIONAL GROUPS," by Wu et al. as inventors, which is a continuation-in-part claiming priority under 35 USC 120 from U.S. patent application Ser. No. 10/672,311, filed on Sep. 26, 2003, which is now U.S. Pat. No. 7,208,389, issued on Apr. 24, 2007, titled "METHOD OF POROGEN REMOVAL FROM POROUS LOW-K FILMS USING UV RADIATION," by Tipton et al. as inventors, which claims benefit under 35 USC 119 from U.S. Provisional No. 60/469,433, filed on May 9, 2003, titled "METHODS FOR PRODUCING LOW STRESS POROUS LOW-K DIELECTRIC MATERIALS USING PRECURSORS WITH ORGANIC FUNCTIONAL GROUPS," by Wu et al. as inventors," and which is a continuation-in-part claiming priority under 35 USC 120 from U.S. patent application Ser. No. 10/404,693, filed on Mar. 31, 2003, titled "METHOD FOR FORMING POROUS FILMS BY POROGEN REMOVAL COMBINED WITH IN SITU SURFACE MODIFICATION," by Humayun et al. as inventors, which applications are incorporated herein by reference in their entireties for all purposes. This application is also related to U.S. patent application Ser. No. 10/789,103, filed on Feb. 27, 2004, which is now U.S. Pat. No. 7,390,537, issued on Jun. 24, 2008, entitled "METHODS FOR PRODUCING LOW-K CDO FILMS WITH LOW RESIDUAL STRESS" by Wu et al. as inventors, which application is incorporated herein by reference in its entirety for all purposes.

FIELD OF THE INVENTION

This invention relates to methods for preparing a porous low-k film having low tensile stress and high mechanical strength. The methods involve the use of porogen technology. More specifically, the methods involve the deposition of a precursor film using one or more precursors with organic functional groups. Functional groups include moieties with carbon-carbon double or triple bonds and bulky organic groups. Once the precursor film is formed, the porogen is removed, leaving a low-k porous film. Methods of the invention provide a low stress, low-k porous film that can be used as a low-k dielectric layer in integrated circuits.

BACKGROUND

There is a general need for materials with low dielectric constants (low-k) in the integrated circuit manufacturing industry. Using low-k materials as the inter-metal and/or inter-layer dielectric of conductive interconnects reduces the delay in signal propagation due to capacitive effects. The lower the dielectric constant of the dielectric, the lower the capacitance of the dielectric and the lower the RC delay of the IC.

Low k dielectrics are conventionally defined as those materials that have a dielectric constant lower than that of silicon dioxide, that is k<~4. Typical methods of obtaining low-k materials include doping silicon dioxide with various hydrocarbons or fluorine. These doping methods, however, generally cannot produce materials with dielectric constants lower than about 2.6. With more and more advanced technology needs, present efforts are focused on developing low-k dielectric materials with k less than 2.5. These ultra low-k dielectrics can be obtained by incorporating air voids within a low-k dielectric, creating a porous dielectric material.

Methods of fabricating porous dielectrics typically involve forming a composite film (sometimes referred to herein as a "precursor film") containing two components: a porogen (typically an organic material such as a polymer) and a structure former or dielectric material (e.g., a silicon containing material). Once the composite film is formed on the substrate, the porogen component is removed, leaving a structurally intact porous dielectric matrix. Techniques for removing porogens from the composite film typically include, for example, a thermal process in which the substrate is heated to a temperature sufficient for the breakdown and vaporization of the organic porogen.

One issue with producing low-k porous materials relates to the fact that generally the more porous the material is (that is, the more air voids within the dielectric matrix), the lower the dielectric constant. In general, a lower dielectric constant is desirable. However, incorporating air voids may also diminish the film's mechanical strength and integrity, including increasing the film's intrinsic residual stress.

What are needed therefore are improved methods for forming porous dielectric low-k films with reduced tensile stress and improved mechanical integrity.

SUMMARY

The present invention addresses the aforementioned need by providing improved methods of preparing a low stress, low-k dielectric material on a substrate using precursors with various functional groups. In some preferred embodiments of the present invention, methods involve (a) forming a precursor film on the substrate, the precursor film comprising a porogen and a structure former, wherein the structure former has one or more carbon-carbon double or triple bonds, and (b) treating the precursor film to facilitate removing the porogen from the precursor film and thereby creating voids within the dielectric material to form the porous low-k dielectric material. In some preferred embodiments, methods involve (a) forming a precursor film on the substrate, the precursor film comprising a porogen and a structure former, wherein the porogen has at least one bulky organic functional group, and (b) treating the precursor film to facilitate removing the porogen from the precursor film and thereby creating voids within the dielectric material to form the porous low-k dielectric material.

In most cases, the structure former will contain derivatives of silicon. The precursor film can be produced by co-depositing the structure former precursor with a porogen precursor or the structure former and porogen can both be obtained from the structure former precursor and no separate porogen precursor is deposited with the structure former precursor.

Examples of suitable structure former precursors that contain C≡C and/or C=C include trimethylsilylacetylene (TMSA), bis(trimethylsilyl)acetylene (BTMSA), triethynylcyclotrisiloxane derivatives, trivinylcyclotrisiloxane derivatives, vinylmethyldimethoxysilane (VMDMOS), methyldimethoxysilaneacetylene (MDMSA), methyldiethoxysilaneacetylene (MDESA), dimethylmethoxysilaneacetylene (DMMSA), dimethylethoxysilaneacetylene (DMESA), methylethoxysilane-di-acetylene (MESDA), divinylmethylethoxysilane (DVMEOS), 1,3,5-trivinyl-1,3,5-trimethylcyclotrisiloxane (VMTS) and 1,3,5-trivinyl-1,3,5-triisopropylcyclotrisiloxane (VPTS). The structure former precursor may also have a bulky organic group. Examples of these bulky organic structure former precursors include, for example, 5-(bicycloheptenyl)methyldimethoxysilane (BMDS), 5-(bicycloheptenyl)triethoxysilane (BTS) and 5-(bicycloheptenyl)diethoxysilaneacetylene (BDS).

The porogen precursor is preferably an organic material that can be easily removed by subsequent processes. One preferred class of porogen precursor is polyfunctional cyclic non-aromatic compounds. More preferably, the polyfunctional cyclic non-aromatic compounds also contains at least one carbon-carbon triple or double bond. Particular examples of preferred compounds are 5-ethylidene-2-norbornene (ENB), 8,8-dimethylfulvene (DMF) and beta-pinene (BP).

The precursor film can be formed using a CVD process (e.g., a plasma enhanced chemical vapor deposition (PECVD) technique), a spin-on process, or another condensed phase method. In preferred embodiments, PECVD techniques are used. For PECVD methods, preferred deposition temperatures typically range between about 25 and 400 degrees Celsius, more preferably between about 100 and 300 degrees Celsius. After the precursor film is formed, treatments such as thermal treatment, plasma treatment, ultraviolet radiation exposure, e-beam exposure, or a combination thereof are used to facilitate removal of the porogen.

These and other features and advantages of the invention will be described in detail below with reference to the associated drawings.

BRIEF DESCRIPTION OF THE DRAWINGS

The following detailed description can be more fully understood when considered in conjunction with the drawings in which.

DETAILED DESCRIPTION OF SPECIFIC EMBODIMENTS

Introduction

Figure 1B:
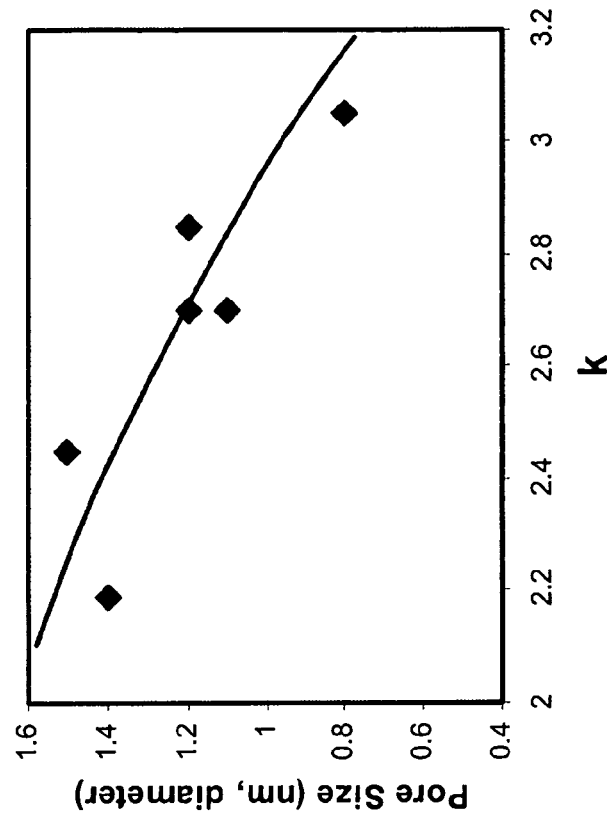
FIGS. 1A and 1B are graphs representing percent porosity and pore size as functions of dielectric constant (k) of porous films prepared using methods of the inventions.

In the following description, numerous specific details are set forth in order to provide a thorough understanding of the present invention, which pertains to formation of porous dielectric materials. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

The present invention involves forming a porous low-k dielectric material by way of a "precursor film" or "precursor layer" that contains a "structure former," typically a silicon and oxide containing dielectric material, which serves as a backbone of the porous network, and a porogen, which generates the porous regions within the porous network. Hence, the porogen and dielectric matrix typically exist as separate phases within the precursor layer. After the precursor film is formed, the porogen is removed from the precursor film to create a dielectric matrix or porous film. Thus, the locations within the precursor film where the porogen once resided become void locations in the final porous dielectric film.

In methods of the invention, there are two general approaches to forming the precursor film. Both of these approaches should be kept in mind as viable techniques that can be used in accordance with methods of the invention. In one approach, a structure former precursor and a porogen precursor is co-deposited on a substrate to create the precursor film. The structure former precursor and porogen precursor may be co-deposited in one process or in a multiple-phase process. Of course, more than one type of structure former precursor molecule and more than one type of porogen precursor molecule may be used in any suitable combination. In an alternative approach, the structure former precursor comprises both the structure former and porogen. That is, the structure former precursor contains moieties serving as structure formers covalently bonded to moieties, preferably large bulky organic constituents, serving as the porogen. Thus, in the latter approach, the structure former precursor can be deposited without a separate porogen precursor to form the precursor layer. Also in the latter approach, more than one type or structure former precursor may be used to form the precursor film.

The present invention involves producing low-k porous dielectric film with improved film mechanical integrity. One measure of mechanical integrity is residual stress. Residual stress is comprised of an extrinsic stress component and an intrinsic stress component. Extrinsic stress is produced from a source external to the film. In integrated circuits, extrinsic stress is typically caused by the mismatch in thermo-mechanical properties between a dielectric layer and the underlying substrate, especially a mismatch in their thermal expansion coefficients. Lowering deposition temperature will minimize the extrinsic stress in a film, as will a smaller mismatch in coefficients of thermal expansion between the film and the substrate. Intrinsic stress can be traced to the film-growth mechanism and the final lattice structure of the dielectric material. From a materials standpoint, the intrinsic stress in porous dielectric films is determined by the integrity of the dielectric backbone structure. The present invention primarily focuses on improving the intrinsic stress of the porous film while maintaining a low dielectric constant.

As indicated previously, the precursor layer comprises a structure former and porogen. In some preferred embodiments of the present invention, the structure former includes at least two carbon atoms that are double or triple bonded. In these cases, the carbon-carbon double and triple bonds are preferably directly adjacent to the silicon atom in the structure former precursor. Many different chemical compositions may be used as the structure former precursor. In most cases, the structure former precursor includes at least silicon and oxygen since in many cases the network backbone is silicon oxide based. The structure former precursor may also include other elements such as halides. For relatively thick precursor layers, it will sometimes be desirable to use structure formers that are not opaque to the UV radiation if UV radiation methods are used to subsequently remove the porogen.

Examples of preferred structure former precursors include various organic silanes and organic siloxanes. Some specific examples of suitable structure former precursor with carbon-carbon double bonds include trivinylcyclotrisiloxane derivatives, tetravinylcyclotetrasiloxane derivatives, vinylmethyldimethoxysilane (VMDMOS) and divinylmethylethoxysilane (DVMEOS). Some specific examples of suitable structure former precursor with carbon-carbon triple bonds include triethynylcyclotrisiloxane derivatives, trimethylsilylacetylene (TMSA), bis(trimethylsilyl) acetylene (BTMSA), methyldimethoxysilaneacetylene (MDMSA), methyldiethoxysilaneacetylene (MDESA), dimethylmethoxysilaneacetylene (DMMSA), dimethylethoxysilaneacetylene (DMESA), methylethoxysilane-di-acetylene (MESDA), 1,3,5-trivinyl-1,3,5-trimethylcyclotrisiloxane (VMTS) and 1,3,5-trivinyl-1,3,5-triisopropylcyclotrisiloxane (VPTS). In some cases, the structure former precursor additionally contains bulky organic functional groups. Once deposited, the bulky organic functional groups will be considered part of the porogen in the precursor film since they will also be removed to leave void regions in the resultant porous film. As such, these structure former precursors that contain bulky organic functional groups may be deposited with or without a porogen precursor. Examples of these types of structure former precursors include 5-(bicycloheptenyl) methyldimethoxysilane (BMDS), 5-(bicycloheptenyl)triethoxysilane (BTS) and 5-(bicycloheptenyl)diethoxysilaneacetylene (BDS).

Although not wishing to be bound by theory, it is believed that carbon-carbon double and triple bonds as part of the structure former precursor promotes cross-linking, i.e., polymerization, within the structure former, which has been found to strengthen the integrity of the dielectric backbone and reduce internal stress of the film. It is believed that the carbon-carbon double and/or triple bonds promote cross-linking by introducing additional bonds of different length, bonds of different angles. And, in fact, it has been found through this invention that intrinsic stress can be reduced by incorporating carbon-carbon double and/or triple bonds. Some more details as to how carbon-carbon double and triple bonds relate to the intrinsic stress and other mechanical properties of a non-porous dielectric materials can be found in the previously mentioned U.S. patent application Ser. No. 10/789,103, which is incorporated herein in its entirety.

Regarding the porogen, generally, a porogen is any removable material that defines void regions in a dielectric matrix. Frequently, though not necessarily, the porogen and corresponding porogen precursor are organic materials. One preferred class of porogen precursors is the polyfunctional cyclic non-aromatic compounds. In particular, the porogen precursor will preferably include functional groups such as —CH═CH$_2$, —CH═CH—, —C≡CH, —C≡C—, —C═O and/or —COC—. One class of suitable compounds is norbornenes, such as 5-ethylidene-2-norbornene (ENB). Another typical example is 1,2,3,4-tetramethyl-1,3-cyclopentadiene (TMCP) (C$_9$H$_{14}$). A listing of more porogen precursor compounds can be found in U.S. patent application Ser. No. 10/672,311, which the present application is a continuation-in-part and which is incorporated herein in its entirety.

In some preferred embodiments of the present invention, the porogen has at least one bulky organic functional group. The bulky organic group could originate from the structure former precursor, as mentioned previously, or it could originate from the porogen precursor, if a porogen precursor is used. In other cases, both the structure former precursor and the porogen precursor have bulky organic groups. The bulky organic group will leave correspondingly sized pores in the resulting dielectric film. As such, to a large degree, one can choose the size of pores and the amount of void regions within the final porous film by the type and size of organic groups incorporated in the precursor film. It is generally desirable that the voids, and therefore the organic portions, i.e., porogen, be evenly distributed throughout the porous material and, to a certain extent, to be sufficiently large so as to incorporate more air in the film and thereby lower the overall dielectric constant of the film. Of course, the adding voids that are too large or that are not evenly distributed will sacrifice the integrity of the film. As known in the art, numerous suitable compounds can be classified as having bulky organic constituents, including those compounds having large linear or cyclic groups. In preferred embodiments, the bulky organic groups are three-dimensional polyfunctional groups that are spherical in shape. Examples of some preferable compounds include norbornenes, such as 5-ethylidene-2-norbornene (ENB). Other specific examples include 8,8-dimethylfulvene (DMF) and beta-pinene (BP). Some affects of using various porogen precursors on pore size, porogen concentration and dielectric constant are described by FIGS. 1A, 1B, 2A, 3A, 4A and corresponding descriptions below.

In certain preferred embodiments, the structure former includes at least two carbon atoms that are double or triple bonded and one or both of the structure former and/or porogen has at least one bulky organic functional group. In these cases, the residual stress reduction provided by the carbon-carbon double and/or triple bonds in the structure former precursor is combined with the low-k properties provided by the large porous regions left by the bulky organic groups.

Regarding techniques for depositing the precursor film, any of numerous techniques may be used. Typical methods include spin-coating processes, print-on, dip coating, thermal process and chemical vapor deposition—particularly plasma enhanced chemical vapor deposition (PECVD). Depending on the application, the thickness of the precursor film may range between about 30 nanometers and about 5 micrometers. Details of suitable deposition techniques are described in the cross-referenced and related references cited above and which are incorporated herein in their entireties. In preferred embodiments of the present invention, PECVD methods are utilized. It is noted that the invention is not limited to any particular type of deposition method. If PECVD processes are used, the deposition temperatures typically range between about 25 and about 450 degrees Celsius and chamber pressures typically range between about 1 Torr to 10 Torr. Of course, numerous factors dictate optimal deposition temperatures, gas flow rates and other process parameters.

The thickness of the precursor film (and hence the resulting porous dielectric layer) depends upon the ultimate application. As an example, the thickness may range between about 50 to 1500 angstroms for a hard mask application. For an interlayer dielectric or packaging application, the thickness may range up to about 0.1 to 5 microns. In some cases, extra thickness is required to provide some amount of sacrificial dielectric to accommodate a subsequent planarization step. In some cases, the thickness of the precursor layer may be driven in part by the ability of the UV radiation to penetrate the film and remove the porogen. Therefore relatively thinner precursor layers may be required for some processes.

Any suitable method may be used to remove the porogen from the precursor film. Preferred methods generally involve treating precursor film in such a manner that the porogen is at least partially decomposed and the decomposition products are volatilized away from the deposited precursor film. Typical methods include, for example, thermal processes (both slow and rapid), UV mediated methods wherein the precursor film is exposed to UV light, and e-beam methods. Note, however, the invention is not limited to any particular type of porogen removal method. For example, liquid solvent techniques may also be used. Note that the precursor layer formation and porogen removal operations can be conducted in a single vessel or in two separate vessels. Also, it is possible for a precursor layer formation and porogen removal to occur in one chamber and then for the substrate to be moved to a different chamber where more of the porogen is removed. In general, however, for mechanical simplicity, it is preferred to perform as many operations as possible in a single chamber.

After porogen removal, the resultant porous dielectric film will preferably have a dielectric constant less than about 2.7, preferably less than 2.5, and the low tensile stress, as measured by a Tencor FLX 5400 Automated Thin Film Stress Measurement System, will preferably be less than about 50 MPa.

Note that after the porogen is removed, any number of post porogen removal treatments may be implemented on the porous film. For example, a silanol capping process to replace dangling hydroxyl groups with non-polar groups (e.g., alkyl groups) and help the film maintain a low overall dielectric constant may be used. Details of some example suitable silanol capping methods are described in U.S. patent application Ser. No. 10/672,311, which the present application is a continuation-in-part and which is incorporated herein in its entirety.

EXAMPLES

The following examples, Examples 1-6, are presented to help illustrate aspects of the invention. It should be understood that these examples are representative only, and that the invention is not limited by the detail set forth in these examples. Note also that the following examples are merely experimental and do not necessarily represent optimized conditions for preparing low-k, low stress porous films.

Example 1 illustrates eight porous films (Films A-F) prepared using different structure former precursors and porogen precursors (if used) using methods in accordance with the invention. Examples 2-6 illustrate the affects of using various process parameters such as precursor concentrations, flow rates, deposition temperatures and porogen removal techniques to prepare porous films.

Example 1

The following porous films (Films A-F) have been formed using methods in accordance with the invention. In some cases, the films were prepared using a structure former precursor without double or triple carbon-carbon bonds (e.g., DEMS, TMCTS) but with a porogen precursor with a bulky organic group (e.g., ENB, BP) (see Films A, D, E and F). As previously described, ENB and BP porogen precursors have polyfunctional groups, which can extend their structures in three dimensions and form spherically-shaped, bulky functional polymer. In one case, the film was prepared using a structure former precursor with double or triple carbon-carbon bonds (i.e., BTMSA) and no porogen precursor was used (see Film B below). And in one case, the film was prepared using a structure former precursor with double or triple carbon-carbon bonds (i.e., BTMSA) with a porogen precursor having a bulky organic group (i.e., ENB) (see Film C below). The following are descriptions of the precursor compositions and processes conditions for preparing Films A-F, with resulting k values and intrinsic stress/hardness values. In all examples, PECVD methods were used to deposit the precursor films and UV exposure methods were used to remove the porogen to form the porous films.

Figure 1A:
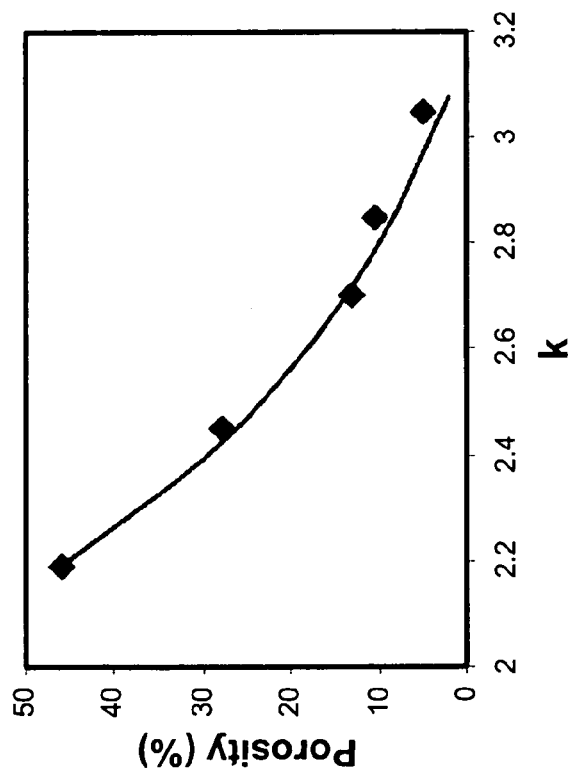

Films A1, A2 and A3: Three porous films, A1, A2 and A3, were prepared with the following precursors and process conditions using different amounts of porogen precursor and structure former precursor. Precursors: DEMS structure former precursor and ENB is a porogen precursor. Deposition conditions: high frequency RF power of 2500 Watts, ENB flow rate of 3 ccm, DEMS at a flow rate of 2 ccm, $CO_2$ flow rate of 6000 sccm, chamber pressure kept at 9.5 Ton, and deposition temperature of 250 degrees Celsius. Porogen removal conditions: UV exposure for 7 minutes. FIGS. 1A and 1B are graphs showing % porosity and pore size, respectively, as functions of the dielectric constant (k) of resulting porous films. As shown, the percent porosity in the film decreased with increasing k. This is an expected result since increasing the total amount of air voids within the film is expected to decrease the k of the film. In this example, the pore size decreases slightly with increasing k.

Film B: Precursors: BTMSA structure former precursor only. Deposition conditions: high frequency RF power of 2200 Watts, BTMSA flow rate of 1.5 ccm, $CO_2$ flow rate of 3000 sccm, chamber pressure kept at 7.5 Ton, and deposition temperature of 350 degrees Celsius. Porogen removal conditions: UV exposure for 2.5 minutes. The resulting porous film had a k value of 2.50.

Film C: Precursors: BTMSA structure former precursor and ENB porogen precursor. Deposition conditions: high frequency RF power of 1200 Watts and low frequency RF of 300 Watts, BTMSA flow rate of 2 ccm, ENB flow rate of 1 ccm, $CO_2$ flow rate of 3000 sccm, chamber pressure kept at 7 Ton, and deposition temperature of 285 degrees Celsius. Porogen removal conditions: Thermal treatment for 4 hours. The resulting porous film had a k value of 2.55 and intrinsic stress value of 46 MPa.

Film D: Precursors: DEMS structure former precursor and ENB porogen precursor. Deposition conditions: high frequency RF power of 2500 Watts, DEMS flow rate of 2 ccm, ENB flow rate of 2 ccm, $CO_2$ flow rate of 6000 sccm, chamber pressure kept at 9.5 Torr, and deposition temperature of 250 degrees Celsius. Porogen removal conditions: Thermal treatment for 4 hours, resulting k value of 2.37. Post-porogen removal treatment: UV exposure (1.75 $W/cm^2$) for 4 minutes. The resulting porous film had a k value of 2.39 and hardness value of 1.4 GPa.

Film E: Precursors: TMCTS structure former precursor and ENB porogen precursor. Deposition conditions: high frequency RF power of 1200 Watts, TMCTS flow rate of 1 ccm, ENB flow rate of 0.5 ccm, $CO_2$ flow rate of 5000 sccm, chamber pressure kept at 6 Ton, and substrate temperature of 70 degrees Celsius. Porogen removal conditions: Thermal treatment. The resulting porous film had a k value of 2.48.

Film F: Precursors: TMCTS structure former precursor and BP porogen precursor. Deposition conditions: high frequency RF power of 1000 Watts, TMCTS flow rate of 1 ccm, BP flow rate of 2 ccm, $CO_2$ flow rate of 7000 sccm, chamber pressure kept at 7.5 Torr. Porogen removal conditions: Thermal treatment. The resulting porous film had a k value of 2.5.

Example 2

Figure 2A:
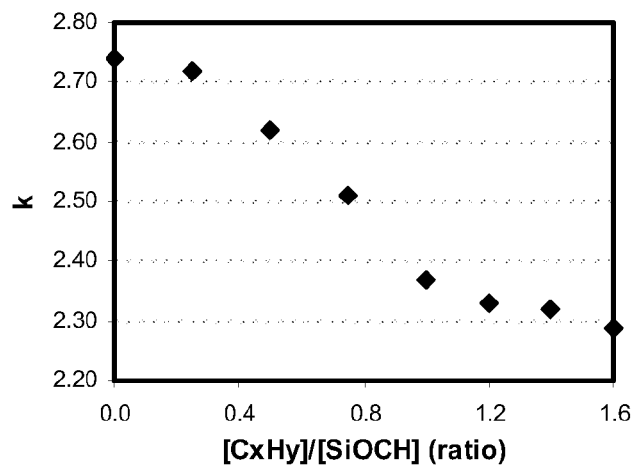
FIGS. 2A-2C are graphs representing the affects of using different precursor concentration on the dielectric constant, amount of porogen and residual film stress for porous films.
Figure 2B:
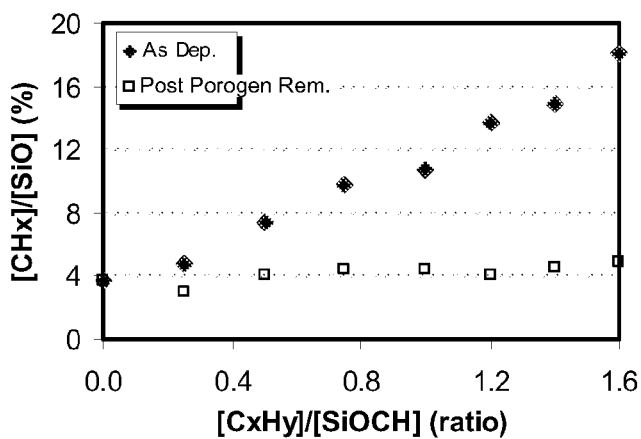
Figure 2C:
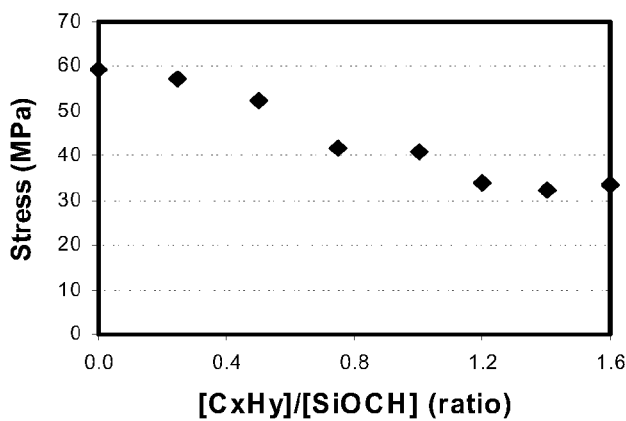

FIGS. 2A, 2B and 2C are graphs showing the affects of using different precursor concentrations of eight sample films. DEMS was used as the structure former precursor and ENB was used as the porogen precursor in each of the eight samples. The amount of ENB to DEMS ([ENB]/[DEMS]) ranged in value from 0 to about 1.6. All samples were treated with thermal treatments at 425 degrees Celsius for 4 hours to remove porogen. FIG. 2A shows that the k value of resulting porous films decreased with increasing amounts of ENB (CxHy) porogen precursor. Specifically, the k values decreased from about 2.75 to about 2.29 as [CxHy]/[SiOCH] increased from 0 to about 1.6. This decrease in k can be attributed to the increasing pore volume percentage since more porogen precursor was used. FIG. 2B shows the amount of $CH_x$ species relative to the amount of SiO species in the resulting porous films, as measured by FTIR. This graph shows that $[CH_x]$/[SiO] increased with increasing [CxHy]/[SiOCH] for the as-deposited (pre-porogen removal) film and that $[CH_x]$/[SiO] remained about the same (i.e., about 4%) with increasing [CxHy]/[SiOCH] after porogen removal. FIG. 2C shows that the intrinsic residual stress decreases with increasing [CxHy]/[SiOCH]. Specifically, the residual stress decreased from about 60 MPa to about 35 MPa as [CxHy]/[SiOCH] increased from 0 to about 1.6.

Example 3

Figure 3:
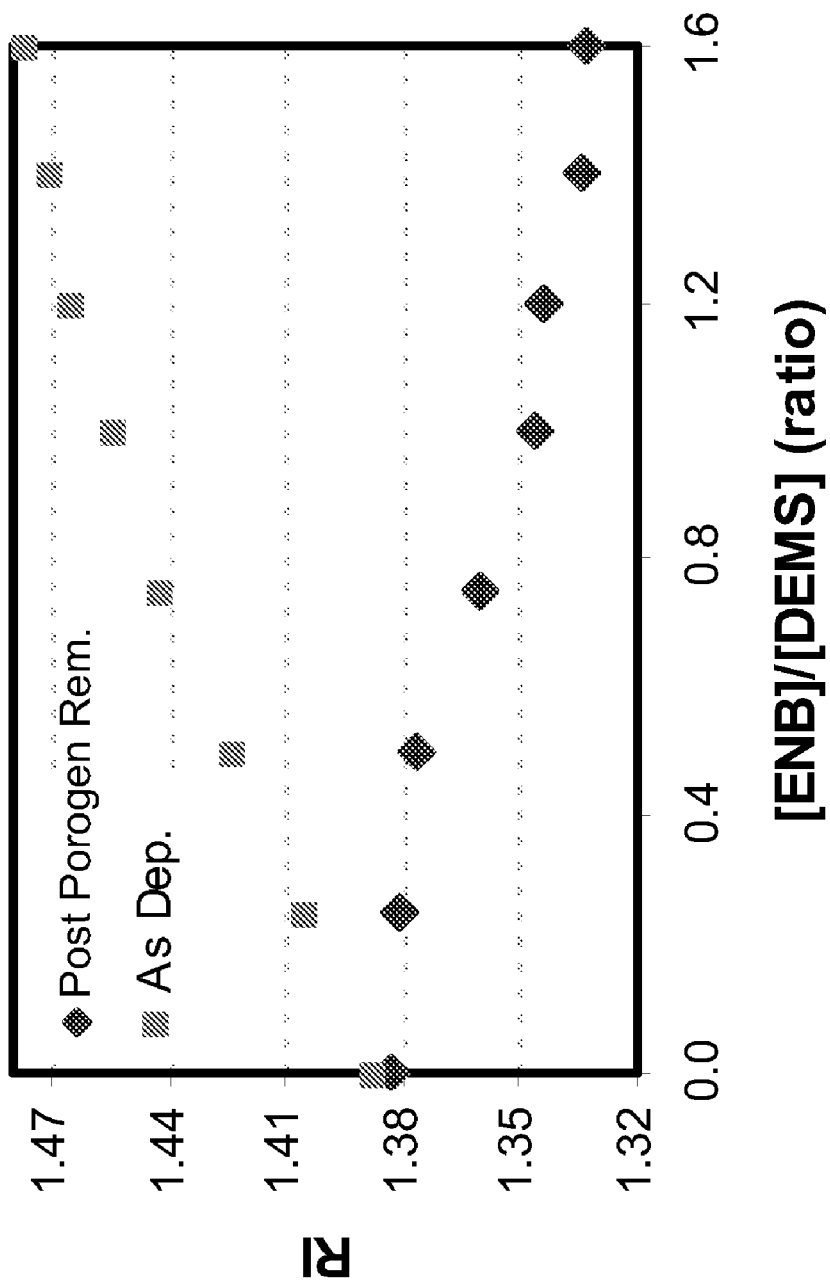
FIG. 3 is a graph representing is a graph representing the affects of using different concentrations of structure former precursors on the refractive indexes of porous films.

FIG. 3 is a graph representing the affects of structure former precursor concentration on the refractive index (RI) of eight sample films. These were the same eight sample films as those used in FIGS. 2A, 2B and 2C. RI is a measure of the opaqueness of the film with increasing RI indicating increasing opaqueness. Note that RI for air (i.e., voids within the film) is the least opaque and therefore will have very low RI. Porogen material is generally more opaque compared to structure former material. The data of FIG. 3 shows that RI for the as-deposited (pre-porogen removal) films increased with increasing [CxHy]/[SiOCH]. After porogen removal, RI decreased with increasing [CxHy]/[SiOCH], which also suggests that the pore volume percentage increases with increasing [CxHy]/[SiOCH].

Example 4

Figure 4A:
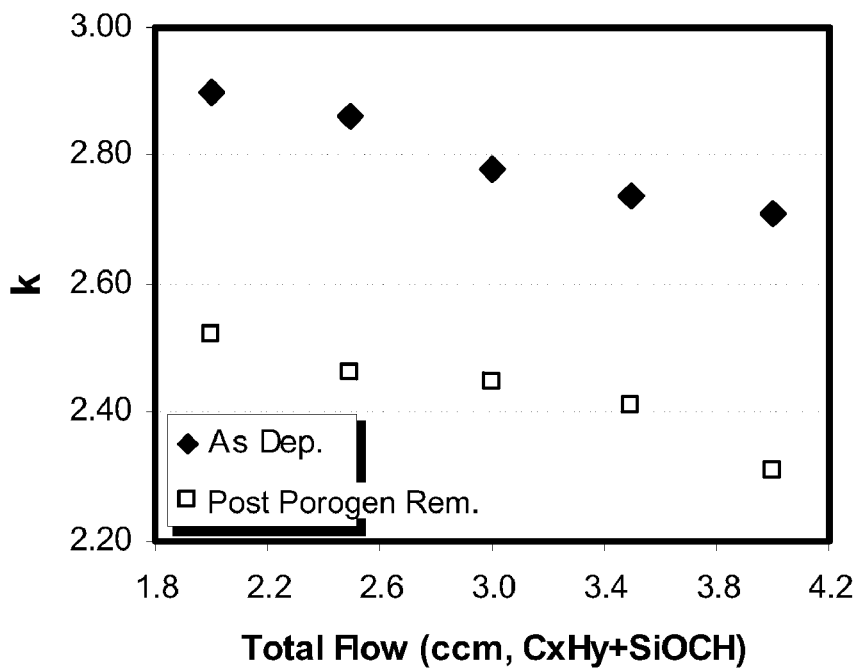
FIGS. 4A and 4B are graphs representing the affects of using different precursor flow rates on the dielectric constant and refractive index of porous films.
Figure 4B:
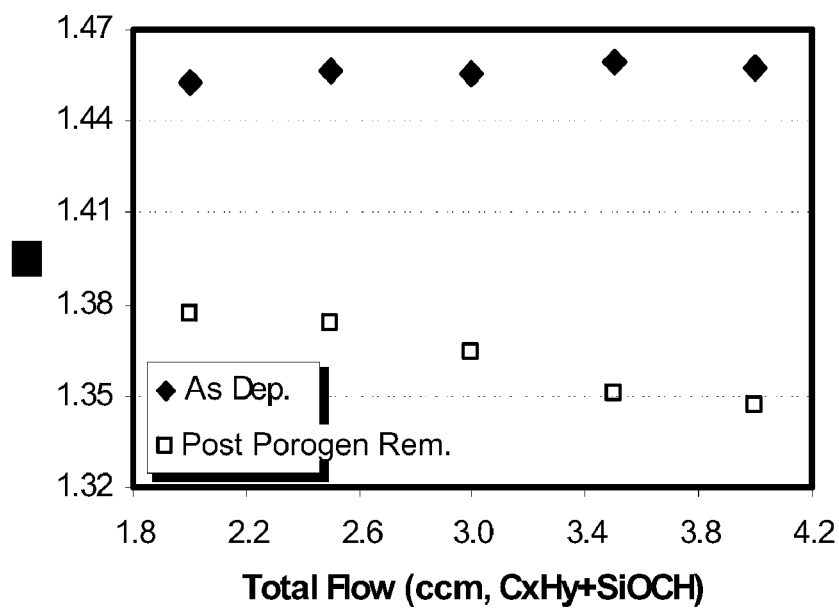

FIGS. 4A and 4B are graphs showing the affects of using different flow rates of the precursors during PECVD deposition process for five sample films. DEMS was used as the structure former precursor and ENB was used as the porogen precursor in each of the five samples. The total flow rate of ENB and DEMS (1:1 ratio) ranged from about 1.9 ccm to about 4.0 ccm. FIG. 4A shows that the k values for the films decreased within increasing total flow rate for the as-deposited (pre-porogen removal) films and for the post-porogen removal films. FIG. 4B shows that the RI remained about the same (around 1.45) as total flow rate increased for the as-deposited film and that the RI slightly decreased as total flow rate increased for the as-deposited film.

Example 5

Figure 5A:
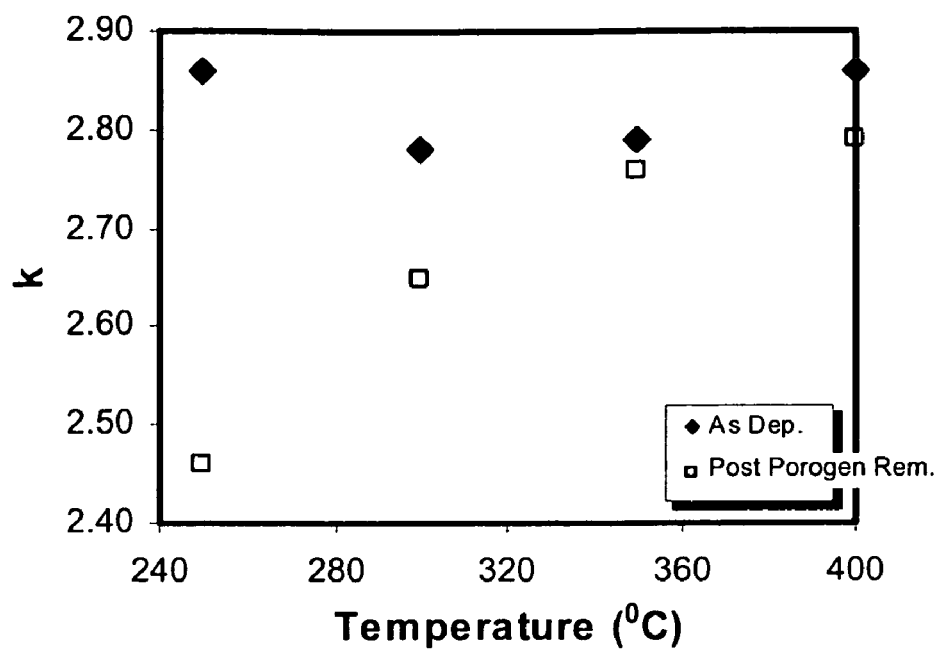
FIGS. 5A and 5B are graphs representing the affects of using different deposition temperatures on dielectric constant and refractive index of porous films.
Figure 5B:
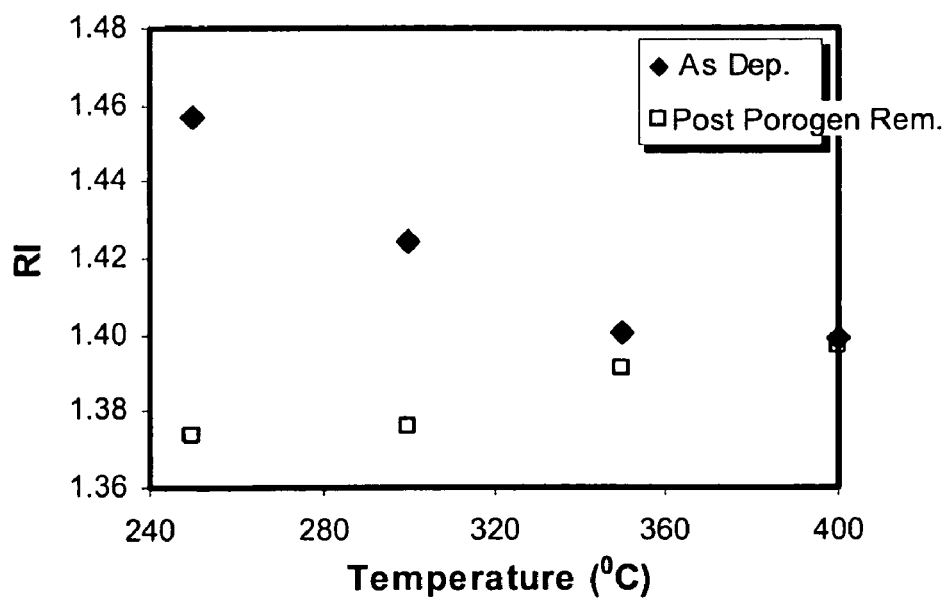

FIGS. 5A and 5B are graphs showing the affects of using different deposition temperatures during PECVD deposition process for four sample films. DEMS was used as the structure former precursor and ENB was used as the porogen precursor in each of the five samples. The deposition temperatures ranged from about 250 to about 400 degrees Celsius. FIG. 5A shows that the k values remained within about 2.78 and 2.87 for the as-deposited films and that the k values increased from about 2.46 to about 2.8 for the post-porogen removal films with increasing deposition temperatures. FIG. 5B shows that the RI remained decreased from about 1.46 to about 1.4 for the as-deposited film and that the RI may have slightly increased from about 1.37 to about 1.4 for the as-deposited film with increasing deposition temperatures.

Example 6

Figure 6:
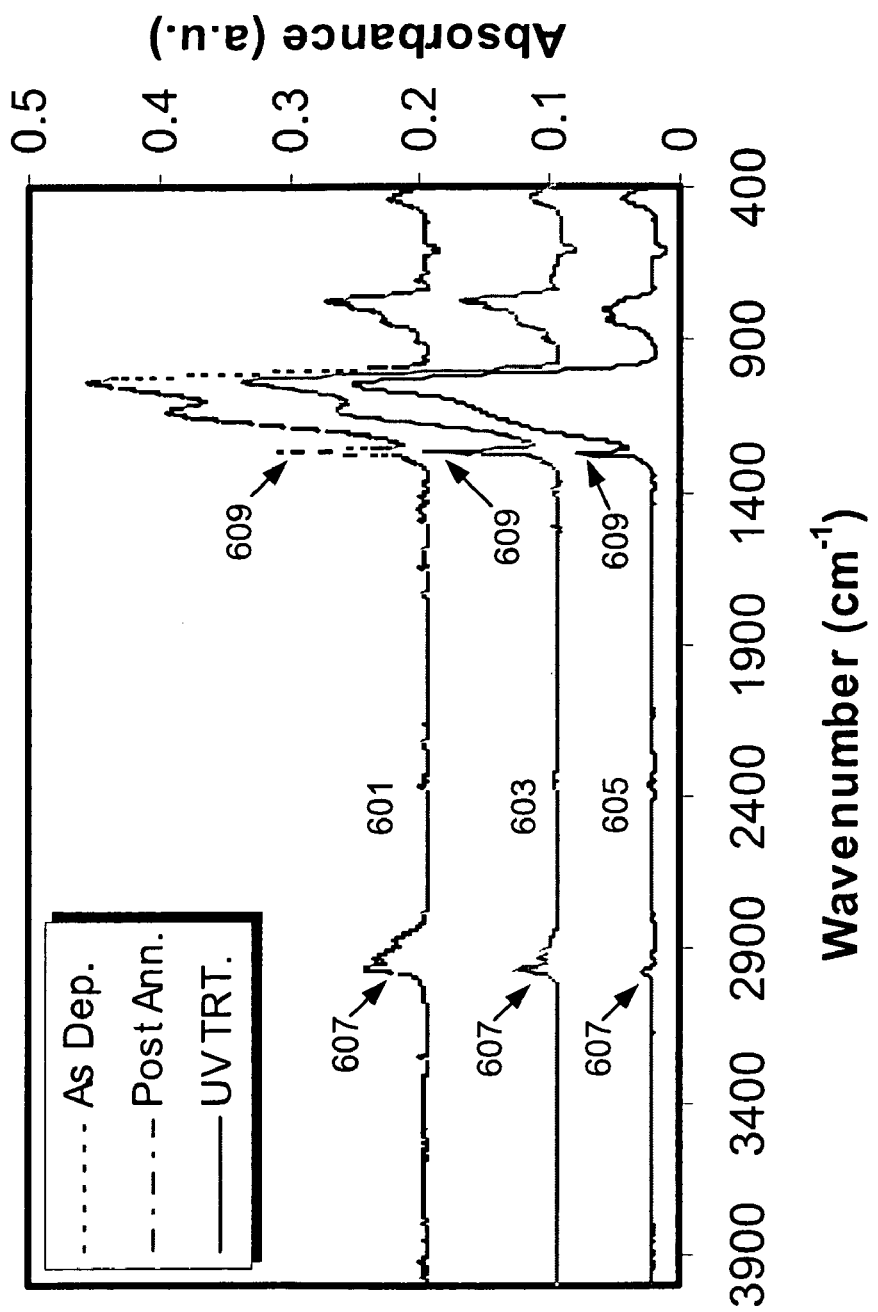
FIG. 6 is a composite graph of three FTIR spectra, one of a precursor film before porogen removal, another of a precursor film after porogen removal using a thermal process, and the third of a precursor film after porogen removal with UV radiation.

FIG. 6 is a composite graph of three FTIR spectra of film samples before porogen removal (spectrum 601), after a thermal treatment (indicated as "post ann.") for porogen removal (spectrum 603) and after a UV exposure treatment for porogen removal (spectrum 605). DEMS was used as the structure former precursor and ENB was used as the porogen precursor for all samples in the same ratios. The thermal treatment involved heating the wafer sample to about 425 degrees Celsius for about 4 hours. The UV treatment involved exposing the wafer sample to broadband UV light of 1.75 Watts/cm$^2$ for about 4 minutes. All three spectra exhibit absorption peaks (607) around 2840 to 3055 cm$^{-1}$ corresponding to the C—H stretch. Note that larger the C—H peaks indicate that more ENB porogen is incorporated into the film. As shown, both the thermally treated sample (spectrum 603) and the UV treated sample (spectrum 605) exhibit reductions in the C—H stretch peaks compared to the pre-treated film (spectrum 601). It is noted that the UV treated sample (spectrum 605) exhibits more of a decrease in the C—H stretch peaks, indicating more porogen removal. Also for all three spectra, the peaks (609) at 1273 cm$^{-1}$ are attributed to the presence of Si—$CH_3$ methyl groups, corresponding to the "T" groups (($SiO)_3$Si—$CH_3$) from the DEMS structure former precursor. Reduction of this peak 609 indicates that more cross-linking has occurred. As shown, the amplitude of this Si—$CH_3$ peak was reduced significantly upon both UV light treatment and thermal treatment with more reduction with the UV light treatment. The spectra of FIG. 6 suggest that in comparing thermal treatment and UV light treatment, UV light treatment was more successful at removing porogen and promoting cross-linking.

Apparatus

The present invention can be implemented in many different types of apparatus. Generally, the apparatus will include one or more chambers (sometimes referred to as process vessels) that house one or more wafers and are suitable for wafer processing. In some cases, at least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation) during porogen removal and post porogen removal processes such as anneal and silanol capping, if used. For certain operations in which the wafer is to be heated, the apparatus may include a heating platen.

Figure 7:
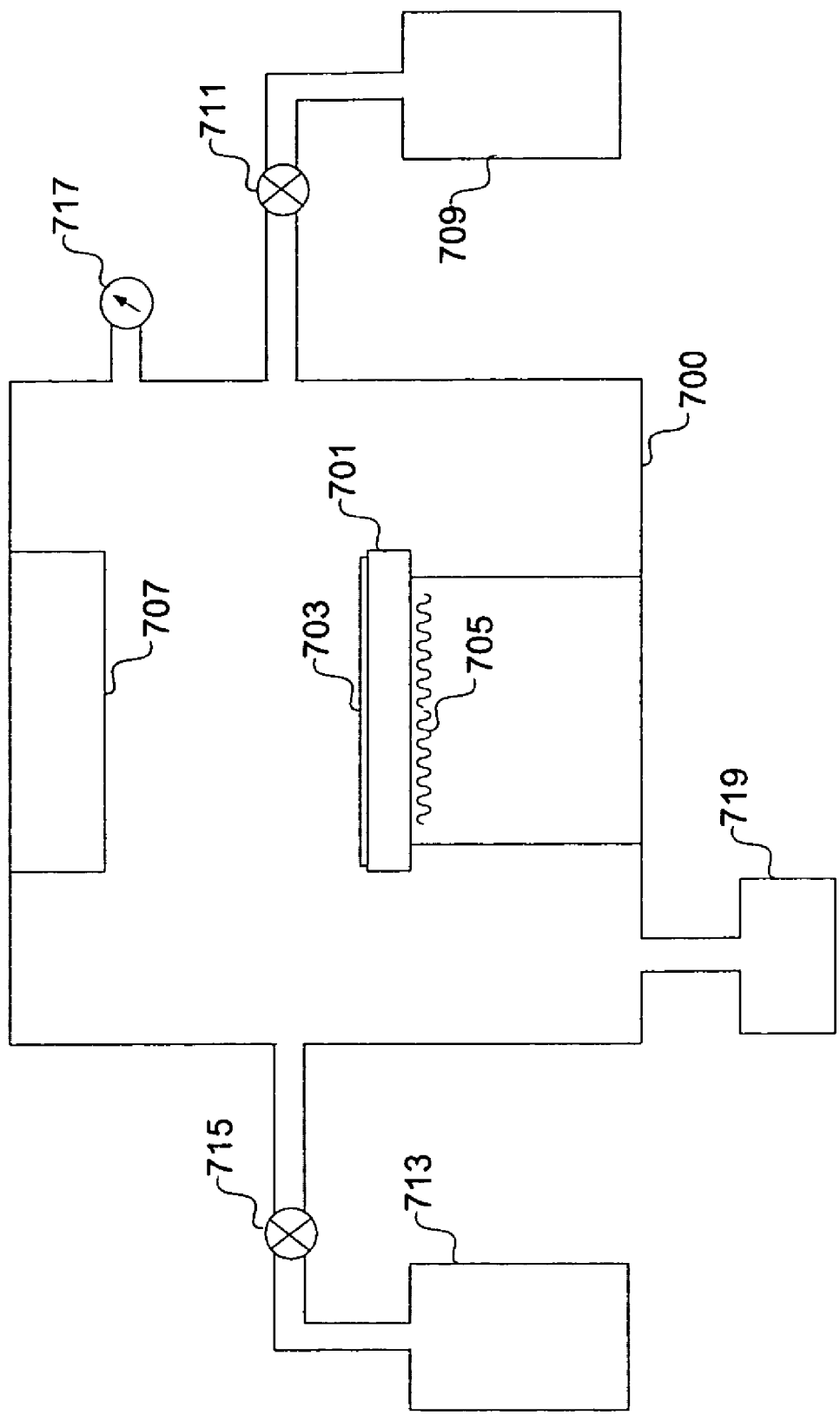
FIG. 7 is a schematic representation of apparatus suitable for porogen removal in accordance with certain embodiments of this invention.

FIG. 7 is a schematic diagram of an example chamber system in accordance with the invention. This particular system is configured to use UV light for the porogen removal process. As stated earlier, the invention is not limited to any particular porogen removal methods or associated apparatus. A substrate holder 701 and a UV light source 707 are housed within a chamber 700. In alternate embodiments, the light source may be mounted outside the chamber on a window. Chamber 700 is capable of holding a vacuum and/or containing gases at pressures above atmospheric pressure. Chamber 700 may be one chamber in a multi-chambered system or it may be a stand-alone apparatus. Substrate holder 701 holds substrate 703 such that it can be irradiated with light from UV light source 707. Substrate holder 701 has a heater 705 that can heat the substrate to defined temperatures and can be controlled by a temperature controller (not shown).

UV light source 707 is a xenon lamp or other source of UV radiation of the required characteristics. As indicated above, the UV light source may be a lamp or a laser (not shown), such as an excimer laser, capable of providing intense UV light. In cases where a laser is used, various optical elements may be required to direct the UV light toward portions of the substrate. Methods for directing the laser light at different portions of the substrate at different times will be required as well. In a specific embodiment, the UV source directs UV radiation on the substrate at an intensity of between about 1 $\mu W/cm^2$ and 10 $W/cm^2$ in the range of 200 to 400 nanometers.

Inert gas source 709, such as a nitrogen gas source, can provide inert gas to chamber 700. The amount of inert gas introduced into chamber 700 is controlled by valve 711 and is measured by pressure gauge 717. During normal operation, chamber 700 is first evacuated using vacuum pump 719, and then the inert gas or other gas is introduced to a certain chamber pressure. Next, UV light source 707 is turned on and light is directed onto substrate 703. If an oxygen containing process is employed, oxygen gas source 713 can provide oxygen to chamber 700 controlled by valve 715. Processes involving mixtures of inert gas and oxygen may also be utilized. In cases where UV radiation occurs under vacuum, vacuum pump 719 can be used to pump down chamber 700 and UV irradiation can occur without the introduction of gas.

Note that the apparatus depicted in FIG. 7 is only an example of a suitable apparatus and other apparatuses designed for other methods involved in previous and/or subsequent processes may be used. For example, methods of the invention may be used with a standard PECVD chamber. Some supercritical fluid chamber systems may also be used. Many of these systems may also be used to perform the post-porogen removal anneal and/or silanol capping procedures, if used. Obviously, in these cases, the chamber system will likely be pumped out between each of the process steps.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of forming a low-k dielectric material on a substrate, the method comprising:
   forming a dielectric film on the substrate, the dielectric film comprising a porogen and a structure former, wherein the structure former has one or more carbon-carbon double or triple bonds; and
   removing the porogen from the dielectric film, thereby creating voids within the dielectric film to form the porous low-k dielectric material.

2. The method of claim 1, wherein the structure former and porogen are both obtained from a single structure former precursor.

3. The method of claim 2, wherein the structure former precursor is trimethylsilylacetylene (TMSA), bis(trimethylsilyl)acetylene (BTMSA), vinylmethyldimethoxysilane (VMDMOS), methyldimethoxysilaneacetylene (MDMSA), methyldiethoxysilaneacetylene (MDESA), dimethylmethoxysilaneacetylene (DMMSA), dimethylethoxysilaneacetylene (DMESA) methylethoxysilane-di-acetylene (MESDA), divinylmethylethoxysilane (DVMEOS), 1,3,5-trivinyl-1,3,5-trimethylcyclotrisiloxane (VMTS), 1,3,5-trivinyl-1,3,5-triisopropylcyclotrisiloxane (VPTS) and vinyltrimethylsilane (VTMS).

4. The method of claim 2, wherein the structure former precursor is 5-(bicycloheptenyl)methyldimethoxysilane (BMDS), 5-(bicycloheptenyl)triethoxysilane (BTS) or 5-(bicycloheptenyl)diethoxysilaneacetylene (BDS).

5. The method of claim 1, further comprising exposing the dielectric film to a thermal treatment, ultraviolet radiation, e-beam exposure, or a combination thereof.

6. The method of claim 1, wherein the dielectric constant of the porous low-k dielectric material is less than or equal to about 2.7.

7. The method of claim 1, wherein the dielectric constant of the porous low-k dielectric material is less than or equal to about 2.5.

8. The method of claim 1, wherein the dielectric film is formed by a chemical vapor deposition process.

9. The method of claim 1, wherein the dielectric film is formed by a spin-on technique.

10. The method of claim 1 wherein the hardness of the low-k dielectric material is greater than about 1.0 GPa.

11. The method of claim 1, wherein the dielectric constant of the porous low-k dielectric material is less than or equal to about 2.7 and the hardness is greater than about 1.0 GPa.

12. The method of claim 1, wherein the tensile stress of the porous low-k dielectric material is less than about 55 MPa.

13. A method of forming a low-k dielectric material on a substrate, the method comprising:
   forming a dielectric film on the substrate, the dielectric film comprising a porogen and a structure former, wherein the structure former has one or more carbon-carbon double or triple bonds and wherein the structure former and porogen are both obtained from a single structure former precursor; and
   removing the porogen from the dielectric film, thereby creating voids within the dielectric film to form the porous low-k dielectric material.

14. The method of claim 13, wherein the structure former precursor is trimethylsilylacetylene (TMSA), bis(trimethylsilyl)acetylene (BTMSA), vinylmethyldimethoxysilane (VMDMOS), methyldimethoxysilaneacetylene (MDMSA), methyldiethoxysilaneacetylene (MDESA), dimethylmethoxysilaneacetylene (DMMSA), dimethylethoxysilaneacetylene (DMESA) or methylethoxysilane-di-acetylene (MESDA), divinylmethylethoxysilane (DVMEOS), 1,3,5-trivinyl-1,3,5-trimethylcyclotrisiloxane (VMTS), 1,3,5-trivinyl-1,3,5-tri-isopropylcyclotrisiloxane (VPTS) and vinyltrimethylsilane (VTMS).

15. The method of claim 13, wherein the structure former precursor is 5-(bicycloheptenyl)methyldimethoxysilane (BMDS), 5-(bicycloheptenyl)triethoxysilane (BTS) or 5-(bicycloheptenyl)diethoxysilaneacetylene (BDS).

16. The method of claim 13, further comprising exposing the dielectric film to a thermal treatment, ultraviolet radiation, e-beam exposure, or a combination thereof.

17. The method of claim 13, wherein the dielectric constant of the porous low-k dielectric material is less than or equal to about 2.7.

18. The method of claim 13, wherein the dielectric constant of the porous low-k dielectric material is less than or equal to about 2.5.

19. The method of claim 13, wherein the hardness of the low-k dielectric material is greater than about 1.0 GPa.

20. The method of claim 13, wherein the dielectric constant of the porous low-k dielectric material is less than or equal to about 2.7 and the hardness is greater than about 1.0 GPa.

* * * * *